United States Patent [19]

Chang et al.

[11] Patent Number: 4,962,049
[45] Date of Patent: Oct. 9, 1990

[54] PROCESS FOR THE PLASMA TREATMENT OF THE BACKSIDE OF A SEMICONDUCTOR WAFER

[75] Inventors: Mei Chang, Cupertino; David Cheng, San Jose, both of Calif.

[73] Assignee: Applied Materials, Inc., Santa Clara, Calif.

[21] Appl. No.: 337,607

[22] Filed: Apr. 13, 1989

[51] Int. Cl.[5] ............... H01L 21/00; H01L 21/02; H01L 21/318; H01L 21/58
[52] U.S. Cl. ..................... 437/13; 437/238; 437/235; 437/241; 437/242; 437/10; 437/239
[58] Field of Search ............ 437/239, 228, 235, 238, 437/241, 242, 10, 13; 427/39, 35, 38, 42, 50, 51; 204/192.12, 192.25, 192.15, 192.22, 192.23

[56] References Cited

U.S. PATENT DOCUMENTS

| | | | |
|---|---|---|---|
| 3,907,660 | 9/1975 | Gillery | 204/192.15 |
| 4,113,599 | 9/1978 | Gillery | 204/192.13 |
| 4,300,989 | 11/1981 | Chang | 437/239 |
| 4,664,938 | 5/1987 | Walker | 427/39 |
| 4,687,682 | 8/1987 | Koze | 437/241 |
| 4,692,344 | 9/1987 | Kaganowicz et al. | 427/39 |
| 4,736,087 | 4/1988 | Whitlock et al. | 156/646 |

Primary Examiner—Brian E. Hearn
Assistant Examiner—B. Everhart
Attorney, Agent, or Firm—Paul L. Hickman; John P. Taylor

[57] ABSTRACT

A process is disclosed for the treatment of the backside or back surface of a semiconductor wafer such as a silicon wafer. By spacing the back side of a semiconductor wafer a predetermined distance from a cathode in a vacuum chamber and controlling the rf power and the pressure, a confined plasma may be used both to clean the back side of the wafer to remove impurities, including moisture and other occluded gases; as well as to deposit a layer of oxide on the back surface of the wafer to inhibit subsequent deposition of poorly adherent materials on the back side of the wafer which might otherwise flake off during processing of the front side of the wafer to form integrated circuits thereon.

20 Claims, 2 Drawing Sheets

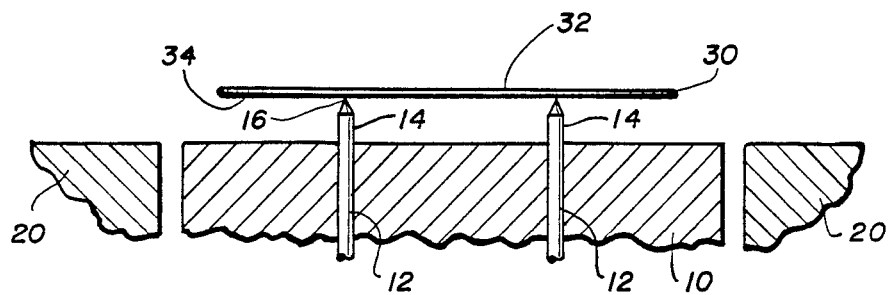
FIG. 2
FIG. 3
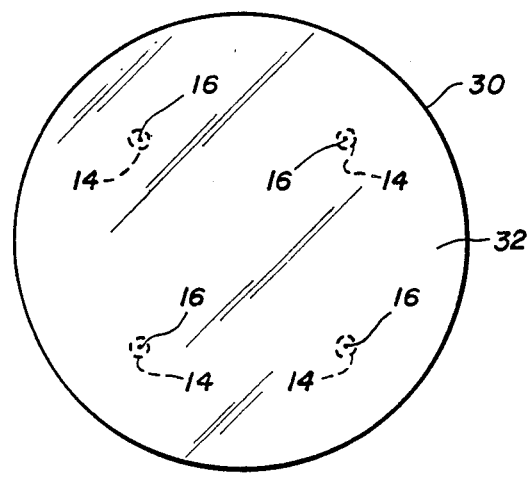

4,962,049

PROCESS FOR THE PLASMA TREATMENT OF THE BACKSIDE OF A SEMICONDUCTOR WAFER

BACKGROUND OF THE INVENTION

1. Field of the Invention

This invention relates to a process for treating the backside of a semiconductor wafer. More particularly, the invention comprises a process for treating the backside of a semiconductor wafer in a manner which will result in the absence of materials on the backside of the wafer which would otherwise interfere with subsequent processing of the wafer.

2. Description of the Related Art

In the formation of integrated circuit structure on a semiconductor wafer such as a silicon wafer, a number of different materials are deposited, patterned, and etched during the construction of the integrated circuits on the wafer.

During each of these steps, it is of utmost importance that no foreign materials, including dust or dirt particles, be in contact with the surface of the wafer, since precise alignment of each patterned layer is essential and the presence of any foreign materials could interfere with the deposition of a layer by causing imperfections in the layer, as well as interfere with the photolithography or etching steps.

In particular, it has been found that if a coating material such as tungsten is deposited on the integrated circuit structure, deposition of a layer of tungsten on the backside of the silicon wafer may occur as well. Unfortunately, this layer of tungsten which deposits on the backside of a silicon wafer adheres rather poorly, resulting in the flaking off of portions of the tungsten from the backside of the wafer. This, in turn, results in the deleterious formation of loose particles which interfere with the remainder of the processing as described above.

It has also been noted that the backside of a semiconductor wafer often comprises minor amounts of foreign materials, including moisture, which must be removed prior to placing the wafer in a high vacuum environment to avoid long baking or outgassing times.

It would, therefore, be desirable to provide a process which would be capable of removing undesirable impurities from the backside of a semiconductor wafer and inhibit the deposit of undesirable materials onto the backside of the wafer as well.

SUMMARY OF THE INVENTION

It is, therefore, an object of this invention to provide a process for treating the backside of a semiconductor wafer in a manner which will result in the absence of materials on the backside of the wafer which would otherwise interfere with subsequent processing of the front side of the wafer to form integrated circuit structures thereon.

It is another object of this invention to provide a process for treating the backside of a semiconductor wafer to form a coating thereon which will inhibit the deposition of other poorly adherent materials thereon.

It is yet another object of this invention to provide a process for treating the backside of a silicon wafer to form an oxide coating thereon which will inhibit the deposition of materials thereon which would react with the silicon to form a poorly adherent silicide coating thereon.

It is still another object of this invention to provide a process for treating the backside of a silicon wafer to form an oxide coating thereon which will inhibit the deposition of tungsten on the backside of the silicon wafer.

It is a further object of this invention to provide a process for treating the backside of a semiconductor wafer to remove materials present on the backside of the wafer which would otherwise interfere with subsequent processing of the front side of the wafer to form integrated circuit structures thereon.

These and other objects of the invention will be apparent from the following description and accompanying drawings.

BRIEF DESCRIPTION OF THE DRAWINGS

FIG. 2 is a vertical fragmentary cross-sectional view of apparatus used in the treatment of the backside of the wafer showing the use of support pins to space the underside of the wafer from the cathode.

FIG. 3 is a top view of the semiconductor wafer shown in FIG. 2, illustrating a typical positioning or array of the support pins beneath the wafer.

DETAILED DESCRIPTION OF THE INVENTION

Figure 1:
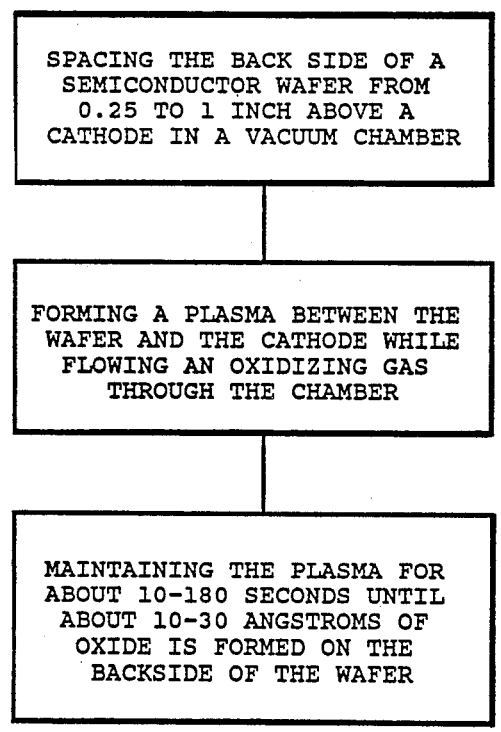
FIG. 1 is a flow sheet describing the process of the invention.

The invention provides a process for the treatment of the backside or back surface of a semiconductor wafer such as a silicon wafer. A plasma may be used both to clean the back side of the wafer to remove impurities, including moisture and other occluded gases, as well as to deposit a layer of oxide on the back surface of the wafer to inhibit subsequent deposition of poorly adherent materials on the back side of the wafer which might otherwise flake off during processing of the front side of the wafer to form integrated circuits thereon.

The terms "backside" or "back surface", when referring to the semiconductor wafer used in the formation of integrated circuit structures, is intended to refer to the non-polished side of the wafer, while the top surface of the wafer refers to that surface of the semiconductor wafer which is normally polished to provide a very flat surface to facilitate subsequent formation of integrated circuit structures thereon.

Referring to FIGS. 2 and 3, a portion of a plasma etching chamber apparatus is shown comprising a conductive cathode 10 surrounded by insulation means 20. Positioned over cathode 10 is a semiconductor wafer 30 having a top surface 32 and a bottom surface 34. Pins 14 protrude upwardly from the surface of cathode 10 to support wafer 30 thereon a spaced distance from cathode 10 of from about 0.25 to about 1 inch to permit formation of a plasma therebetween as will be described below.

Pins 14 are provided with pointed ends 16 to engage the bottom surface 34 of wafer 30 while shielding a minimum area of surface 34. Pins 14 optionally may be retractable into recesses 12 in cathode 10 when not in use, as shown FIG. 2. As shown in FIG. 3, four such pins may be used to space wafer 30 from cathode 10. Other configurations and numbers of support pins can, of course, be used. Pins 14 may be made of any material which will not interfere with the processing of wafer 30. In one embodiment, pins 14 may be constructed of aluminum.

In accordance with the invention, the plasma etch chamber containing wafer 30 is maintained at a pressure of from about 50 to about 300 millitorr and a plasma is ignited between the backside surface 34 of wafer 30 and cathode 10 using conventional rf power generation equipment (not shown) operated at a power range of from about 25 to 100 watts.

In accordance with one aspect of the invention, during ignition of the plasma, a stream of an inert gas such as argon, neon, or helium is flowed through the etching chamber at a rate of about 20 to about 200 sccm. The plasma is maintained for a period of from about 10 to about 60 seconds which is sufficient to remove undesirable impurities, including moisture and other occluded gases from surface 34 of wafer 30. Wafer 30 may then be moved to a high vacuum chamber for further processing without the need for lengthy heating and outgassing to remove such gases and moisture from the back surface of the wafer.

In accordance with the preferred embodiment of the invention, however, an oxidizing gas, rather than an inert gas, is flowed through the etch chamber during the plasma flow to permit formation of an oxide layer on the back surface 34 of wafer 30 to a thickness of from about 10 to about 30 Angstroms, preferably about 20 to about 30 Angstroms, which is sufficient to inhibit the deposition of tungsten or other undesirable materials on back surface 34 of wafer 30 during subsequent processing of wafer 30. As in the cleaning embodiment, the length of time needed to form the oxide layer ranges from about 10 seconds to about 3 minutes, preferably from about 10 seconds to about 60 seconds.

It should be noted that when the oxidizing embodiment of the process of the invention is being practiced, there is no need to clean surface 34 prior to the oxidation since the heat generated by ignition of the plasma has been found to be sufficient to remove any materials on surface 34 which would otherwise interfere with the formation of the desired oxide coating thereon.

Examples of oxidizing gases which may be used in include $O_2$, $N_2O$, $O_3$, and $CO_2$. However, of these gases $O_2$ is the preferred oxygen source, because it is easily available and most efficient for oxidation.

It should be noted that the maximum spacing range of wafer 30 from cathode 10 and the maximum rf power range specified are both important from the standpoint of controlling the extent of the oxidation of back surface 34 of wafer 30. While a larger spacing or a higher power range will still result in oxidation of surface 34, the resulting plasma will be harder to control and contain, resulting in oxidation of not only back surface 34 but front surface 32 of wafer 30 as well.

While some oxidation of front surface 32 of wafer 30 is inevitable during the back surface oxidation process of the invention, any oxidation of front surface 32 must be removed to permit processing of the front surface to construct the desired integrated circuit structures therein. Therefore, it is preferable to form the desired oxidation layer on back surface 34 of wafer 30 under conditions which will minimize the amount of oxide formed on front surface 32.

While temperatures higher than room temperature, e.g., higher than about 20° to about 25° C., may be used during the oxidation process, it is preferable to maintain a temperature not exceeding about 25° C. in the plasma chamber for the same reasons as discussed above with regard to the maximum spacing and power level, i.e., to control the extent of the oxidation and to minimize oxidation of front surface 32 of wafer 30. The temperature in the plasma chamber may be conveniently controlled by the temperature of the gas which is flowed into the chamber, or preferably by using a closed loop of chilled water flowing through the chamber.

It should also be noted that it is preferable that the back side processing of the wafer in accordance with the invention be carried out prior to processing of the front side of the wafer to avoid interfering with any processing already carried out on the front side. However, when the protective oxide layer is formed on the back side surface of the wafer in accordance with the invention, subsequent processing of the front side of the wafer must be carried out in a selective manner which will not result in damage to the oxide layer on the back side of the wafer, such as subsequent wet etching of the front surface to remove oxide.

The following examples will serve to further illustrate the process of the invention.

EXAMPLE I

A 5 inch diameter silicon wafer was spaced on pins 1 inch above a cathode in a plasma chamber evacuated to a pressure of 200 millitorr with the polished side of the wafer facing the cathode to facilitate measurement of the thickness of the oxide formed. While 100 sccm of $O_2$ were flowed through the chamber, a plasma was ignited between cathode and the silicon wafer and then maintained at a power level of 75 watts for 60 seconds. The same procedure was then followed with a second wafer, however with the polished side facing away from the cathode to facilitate measurement of the thickness of the oxide formed on the opposite side of the wafer.

Subsequent measurement of the oxide thicknesses on the two wafers showed that an oxide layer of about 12-20 Angstroms thickness was formed on the polished side of the first wafer facing the cathode, while only about 6 Angstroms of oxide was formed on the polished side of the second wafer facing away from the cathode.

EXAMPLE II

To illustrate the use of $N_2O$, instead of $O_2$ as the oxidizing gas, silicon wafers were process using the procedure of Example I at a pressure of 20 millitorr, and a power level of 20 watts. $N_2O$ was flowed through the chamber at a rate of 50 sccm and the plasma was maintained for 1 minute. Subsequent examination of the wafers showed that about 6-8 Angstroms of oxide were formed on the side of the wafer facing the cathode while 3 Angstroms of oxide were formed on the side of the wafer facing away from the cathode.

EXAMPLE III

To illustrate the difference in deposition of tungsten on a wafer having the backside oxide coating formed in accordance with the invention and a wafer not so treated, a silicon wafer having a 10-20 Angstrom oxide layer formed thereon in accordance with the procedure of Example I and a second silicon wafer not so treated were exposed to a deposition of tungsten by flowing 20 sccm of $WF_6$ gas for 1 minute through a vacuum chamber maintained at 10 Torr and 300° C. Subsequent examination of the two wafers under a microscope showed no reflectivity change on the surface of the wafer coated with oxide in accordance with the invention, while the wafer not so treated showed the surface converted to tungsten almost completely.

Thus, the invention provides a process for treating the back side of a semiconductor wafer which is capable of removing undesirable impurities from the backside of a semiconductor wafer and inhibiting the deposit of undesirable materials onto the backside of the wafer as well.

Having thus described the invention, what is claimed is:

1. A process for treating the back side of a semiconductor wafer which comprises:
    (a) supporting a semiconductor wafer a spaced distance from a cathode with the back side of said wafer facing said cathode; and
    (b) forming a plasma in the gap formed between said cathode and said back side of said wafer to treat said back side of the semiconductor wafer.

2. The process of claim 1 wherein said step of supporting a semiconductor wafer a spaced distance from a cathode further comprises spacing said back side of said wafer a distance of from about 0.25 to about 1 inch from said cathode.

3. The process of claim 2 wherein said process is carried out in a vacuum chamber maintained at a vacuum of from about 50 to about 300 millitorr.

4. The process of claim 3 wherein said step of forming a plasma further comprises maintaining the rf power at from about 25 to about 100 watts to substantially confine said plasma to the back side of said wafer.

5. The process of claim 4 wherein said step of forming a plasma further comprises maintaining said plasma between said back side of said wafer and said cathode for a period of from about 10 second to about 3 minutes.

6. The process of claim 5 wherein said step of flowing a gas through said chamber further includes flowing an inert gas through said chamber at a rate of from about 50 to about 200 sccm.

7. The process of claim 6 wherein said inert gas is selected from the class consisting of argon, neon, and helium.

8. The process of claim 5 wherein said step of flowing a gas through said chamber further includes flowing an oxidizing gas through said chamber at a rate of from about 50 to about 200 sccm to form from about 10 to about 30 Angstroms of an oxide layer on said back side of said wafer.

9. The process of claim 8 wherein said oxidizing gas is selected from the class consisting of $O_2$, $N_2O$, $O_3$, and $CO_2$.

10. A process for treating the back side of a semiconductor wafer to form a protective oxide layer thereon to inhibit subsequent deposition of undesirable materials on said back side of said wafer which comprises:
    (a) supporting a semiconductor wafer in a vacuum chamber at a distance of from about 0.25 to about 1 inch from a cathode with the back side of said wafer facing said cathode;
    (b) flowing an oxidizing gas into said vacuum chamber at a rate of from about 50 to about 200 sccm; and
    (c) forming a plasma in the gap formed between said cathode and said back side of said wafer to form an oxide layer of from about 10 to about 30 Angstroms thickness on said back side of said semiconductor wafer.

11. The process of claim 10 wherein said vacuum chamber is maintained at a vacuum of from about 50 to about 300 millitorr during said plasma oxygen formation.

12. The process of claim 1 wherein the step of forming a plasma further comprises maintaining the rf power generating said plasma at from about 25 to about 100 watts to substantially confine said plasma to the back side of said wafer.

13. The process of claim 12 wherein said plasma is maintained between said back side of said wafer and said cathode for a period of from about 10 second to about 3 minutes to form said oxide layer.

14. The process of claim 13 wherein said oxidizing gas is selected from the class consisting of $O_2$, $N_2O$, $O_3$, and $CO_2$.

15. A process for treating the back side of a semiconductor wafer to form a protective oxide layer thereon to inhibit subsequent deposition of undesirable materials on said back side of said wafer which comprises:
    (a) supporting a semiconductor wafer at a distance of from about 0.25 to about 1 inch from a cathode with the back side of said wafer facing said cathode in a vacuum chamber maintained at a pressure of from about 20 to about 300 millitorr;
    (b) flowing an oxidizing gas into said vacuum chamber at a rate of from about 20 to about 200 sccm;
    (c) forming a plasma with an rf energy of from about 25 to 100 watts in the gap formed between said cathode and said back side of said wafer; and
    (d) maintaining said plasma between said back side of said wafer and said cathode for a period of from about 10 second to about 3 minutes to form an oxide layer of from about 10 to about 30 Angstroms thickness on said back side of said semiconductor wafer.

16. The process of claim 15 wherein said oxidizing gas is selected from the class consisting of $O_2$, $N_2O$, $O_3$, and $CO_2$.

17. A process for treating the back side of a semiconductor wafer which comprises:
    (a) supporting a semiconductor wafer a spaced distance from an electrode with the back side of said wafer facing said electrode
    (b) flowing a gas through said chamber at a rate of from about 50 to about 200 sccm; and
    (c) forming a plasma in the gap formed between said electrode and said back side of said wafer to treat said back side of the semiconductor wafer.

18. A process for treating the back side of a semiconductor wafer which comprises:
    (a) supporting a semiconductor wafer a spaced distance from an electrode with the back side of said wafer facing said electrode;
    (b) flowing an inert gas through said chamber at a rate of from about 50 to about 200 sccm; and
    (c) forming a plasma in the gap formed between said electrode and said back side of said wafer to remove undesirable materials from said back side of the semiconductor wafer.

19. A process for treating the back side of a semiconductor wafer which comprises:
    (a) supporting a semiconductor wafer a distance of from about 0.25 to about 1 inch from an electrode with the back side of said wafer facing said electrode;
    (b) flowing an inert gas through said chamber at a rate of from about 50 to about 200 sccm; and
    (c) forming a plasma in the gap formed between said electrode and said back side of said wafer to remove undesirable materials from said back side of the semiconductor wafer.

20. A process for treating the back side of a semiconductor wafer to form a protective oxide layer thereon to inhibit subsequent deposition of undesirable materials on said back side of said wafer which comprises:

(a) supporting a semiconductor wafer in a vacuum chamber at a spaced distance from an electrode with the back side of said wafer facing said electrode;

(b) flowing an oxidizing gas into said vacuum chamber at a rate of from about 50 to about 200 sccm; and (c) forming a plasma in the gap formed between said electrode and said back side of said wafer to form an oxide layer of from about 10 to about 30 Angstroms thickness on said back side of said semiconductor wafer.

* * * * *